(12) United States Patent
Hong

(10) Patent No.: US 6,452,134 B2
(45) Date of Patent: Sep. 17, 2002

(54) METHOD FOR CORRECTING TEACHING POINTS FOR WELDING ROBOT AND WELDING ROBOT SYSTEM EMPLOYING THE SAME

(75) Inventor: Sung-jin Hong, Seoul (KR)

(73) Assignee: Samsung Electronics, Co., Ltd., Suwon (KR)

( * ) Notice: Subject to any disclaimer, the term of this patent is extended or adjusted under 35 U.S.C. 154(b) by 52 days.

(21) Appl. No.: 09/729,164

(22) Filed: Dec. 5, 2000

(30) Foreign Application Priority Data

Feb. 11, 2000 (KR) .............................................. 00-6488

(51) Int. Cl.[7] .................................................. B23K 9/12
(52) U.S. Cl. .............................. 219/124.34; 219/125.1; 901/42
(58) Field of Search .................... 219/124.34, 125.1; 901/42, 3, 9, 10

(56) References Cited

U.S. PATENT DOCUMENTS

| | | | | |
|---|---|---|---|---|
| 4,249,062 A | * | 2/1981 | Hozumi et al. | 219/124.34 |
| 4,590,577 A | * | 5/1986 | Nio et al. | 364/513 |
| 4,675,502 A | * | 6/1987 | Haefner et al | 219/124.34 |
| 4,761,596 A | * | 8/1988 | Nio et al. | 318/568 |
| 4,970,370 A | * | 11/1990 | Hara | 219/124.34 |
| 5,264,677 A | * | 11/1993 | Sato et al. | 219/124.34 |
| 5,495,090 A | * | 2/1996 | Mukai et al. | 219/124.34 |
| 5,562,843 A | * | 10/1996 | Yasumoto | 219/124.34 |
| 5,582,750 A | * | 12/1996 | Hamura et al. | 219/124.34 |
| 5,845,053 A | * | 12/1998 | Watanabe et al. | 395/97 |
| 5,911,892 A | * | 6/1999 | Kosaka et al. | 219/125.1 |
| 5,932,122 A | * | 8/1999 | Hong | 219/124.34 |
| 6,118,093 A | * | 9/2000 | Hong | 219/61 |

FOREIGN PATENT DOCUMENTS

| | | | | |
|---|---|---|---|---|
| KR | 1998-027370 | 7/1998 | | B23K/37/00 |
| KR | 1998-083281 | 12/1998 | | B23K/9/00 |

* cited by examiner

Primary Examiner—M. Alexandra Elve
Assistant Examiner—Kevin P. Kerns
(74) Attorney, Agent, or Firm—Robert E. Bushnell, Esq.

(57) ABSTRACT

A method for correcting a preset locus of a teaching point for a welding robot having a touch sensor, includes the steps of positioning a workpiece on a welding jig, performing a touch-sensor tracking for the workpiece relative to reference coordinate axes, calculating a displacement of the workpiece through the touch-sensor tracking, and obtaining a new locus of the teaching point based on a transformation matrix generated on the basis of the displacement. With these steps, the teaching points are correctly updated by a touch sensor tracking without an additional equipment for optional sensor tracking, such as laser sensors and arc sensors.

26 Claims, 6 Drawing Sheets

METHOD FOR CORRECTING TEACHING POINTS FOR WELDING ROBOT AND WELDING ROBOT SYSTEM EMPLOYING THE SAME

CLAIM OF PRIORITY

This application makes reference to, incorporates the same herein, and claims all benefits accruing under 35 U.S.C. §119 from my application entitled METHOD AND SYSTEM FOR TEACHING WELDING ROBOT filed with the Korean Industrial Property Office on Feb. 11, 2000 and there duly assigned Serial No. 2000-6488.

BACKGROUND OF THE INVENTION

1. Field of the Invention

The present invention relates in general to methods for correcting teaching points for welding robots and welding robot systems employing the same, and more particularly, to a method for correcting teaching points for a welding robot, by means of a touching sensor, and a welding robot system employing the same.

2. Description of Related Art

Recently, an arc welding has been widely used for industrial applications to weld a variety of materials such as steel sheets, etc. The arc welding generates an arc between a welding torch and workpieces or base metals to be welded and melts a welding wire and the workpieces with an arc energy, to weld the workpieces.

To perform an arc welding, a supply voltage, a distance between a welding torch and a workpiece, a supply speed of a welding wire, a weaving speed of the welding torch, and an initial welding point and a terminating welding point on a welding path, etc. are preprogrammed into a welding robot system depending upon a kind of the workpiece and a quality of welding, etc.

Especially, to perform a high quality of welding, a position of the workpiece should be identified exactly prior to welding. However, errors may be created from positioning devices such as a positioner or a welding jig to fix the workpiece, or from the workpiece itself. Because of these errors, it is not easy for the welding robot to be operated exactly on a desired welding point.

Various tracking techniques have been developed in order to track an exact position of the workpiece. The tracking techniques include an arc sensor tracking, a laser sensor tracking, a touch sensor tracking, etc. The arc sensor tracking uses an arc sensor to correct a displacement of the workpiece in real time when performing a weaving operation against the workpiece to be welded. The laser sensor tracking processes image data for the workpiece obtained by means of a laser vision camera, in order to correct a displacement of the workpiece in real time. The touch sensor tracking is to detect an initial welding point under the state that the workpiece is displaced. The displacement of the workpiece can be corrected in real time by using any of the above-mentioned tracking techniques as necessary.

The arc sensor tracking does not separately need any additional equipment; however, it needs a high-priced software option. The laser sensor tracking is the most typical tracking method, which has a high-performance but requires high-cost additional equipment such as a special laser sensor, etc. In addition, in the laser sensor tracking, a variety of sensors and devices should be attached closely to the welding torch installed at the end of a welding robot's hand, thereby resulting in narrowing a space for welding operation. A main controller which is generally realized as a computer system performs operations of monitoring and sampling a variety of data; and therefore, as the additional equipment increases in number, the likelihood of causing an error in the course of operating the system increases accordingly in a multi-control process during the welding operation. Furthermore, the maintenance and repair of the additional equipment are highly complicated.

Korean Patent Laid-Open No. 98-27370 to Hwang and Hong, titled "A method for controlling a welding robot and an apparatus for controlling the same," one of the inventors of which is the present inventor, discloses a method for detecting an initial welding point and a terminating welding point by means of a touch sensor tracking, after roughly setting up the type of a contact shape formed between workpieces and the initial welding point and the terminating welding point. Another Korean Patent Laid-Open No. 98-83281 titled "A method for detecting an initial welding point of a welding robot," whose inventor is also the present inventor, discloses a method for detecting an exact initial welding point by means of a touch sensor tracking.

The touch sensor tracking is a method of directly detecting a position of a workpiece by means of generating an interrupt from a controller when a welding wire supplied to one end of a welding torch which is positive(+) contacts the workpiece which is negative(−). However, the touch sensor tracking requires a separate tracking mechanism for tracking a welding path to perform the welding operation along the welding path from the initial welding point even though the initial and terminating welding points are detected by the touch sensor tracking. That is, additional equipment such as laser vision sensor, etc. is required, for which the touch sensor tracking has not solved the problems in relation to cost and welding space.

SUMMARY OF THE INVENTION

The present invention has been made keeping in mind the above-described need, and an object of the present invention is to provide a method for correcting teaching points for a welding robot, by means of a touch sensor tracking, and a welding robot system employing the same, so that a welding path is correctly tracked, without additional sensor equipment. According to one aspect of the present invention, this and other objects may be achieved by providing a method for correcting teaching points for a welding robot having a touch sensor, comprising the steps of: mounting a workpiece to a welding jig; establishing at least one teaching point between an initial welding point and a terminating welding point; touch-sensing the workpiece at a point corresponding to the established teaching point through the touch sensor; identifying a point detected by the touch-sensing; and obtaining a new teaching point based on the difference between the established teaching point and the detection point.

Preferably, the step of obtaining the new teaching point includes the sub-steps of generating a transformation matrix based on the difference between the established teaching point and the detection point; and calculating the new teaching point by multiplying the established teaching point by the transformation matrix.

Also, the touch sensor is preferably comprised of a welding wire, provided at an end part of a welding torch.

According to another aspect of the present invention, this and another objects may also be achieved by a provision of a welding robot system comprising a welding jig supporting a workpiece, a welding robot performing a welding operation to the workpiece and having a touch sensor, and a controller for controlling the welding robot, the controller identifying a point detected by touch-sensing the workpiece mounted to the welding jig through the touch sensor between an initial welding point and a terminating welding point, obtaining a new teaching point based on a difference between a preset teaching point and the detection point, and controlling the welding robot based on the new teaching point.

Preferably, the controller generates a transformation matrix based on the difference between the preset teaching point and the detection point, and calculates the new teaching point by multiplying the preset teaching point by the transformation matrix.

Also, the touch sensor is preferably comprised a welding wire, provided at an end part of the welding torch.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
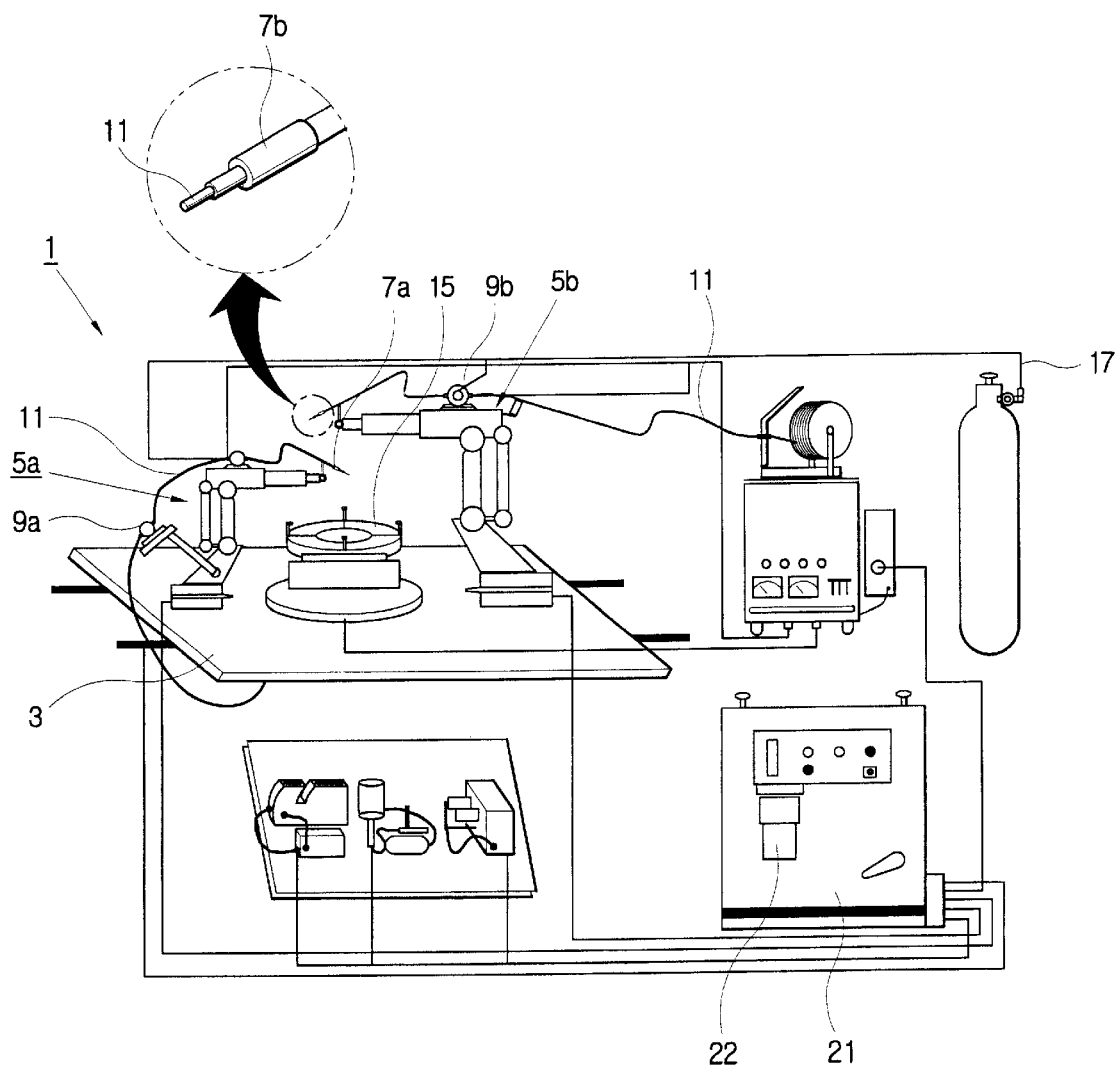
FIG. 1 is a schematic view of a welding robot system employing a method for correcting teaching points for a welding robot, according to the present invention.

Referring to FIG. 1, a welding robot system 1 is comprised of a pair of welding robots 5a and 5b installed oppositely on a base stand 3, a pair of welding torches 7a and 7b supported by the welding robots 5a and 5b, performing an arc welding operation, a pair of wire feeders 9a and 9b supplying a welding wire 11 to the welding torches 7a and 7b, a welding jig 15 provided between the welding robots 5a and 5b, supporting the workpiece to be welded, a gas feeder 17 supplying a shielding gas to the welding torches 7a and 7b, and a controller 21 controlling an operation of the welding robots 5a and 5b.

The welding robots 5a and 5b are vertical six-shaft robots respectively having their driving motors. The welding robots 5a and 5b have header parts on their end parts which are movable in directions of X, Y and Z axes, and the welding torches 7a and 7b are installed on the header parts. The welding torches 7a and 7b are supplied with the welding wires 11 from the wire feeders 9a and 9b, and the wires 11 are protruded toward the centers of the end parts of the welding torches 7a and 7b.

The welding jig 15 supports the workpiece and then displaces it according to a command from the controller 21. The controller 21 is provided with a teaching pendant 22 for teaching welding parameters in conformity with characteristics of an welding operation. External electric power is supplied to the welding torches 7a and 7b according to a command from the controller 21 and the shielding gas is supplied from the gas feeder 17, and the arc is then generated and the arc welding is being performed as the welding wire 11 starts to be melted accordingly.

Figure 2:
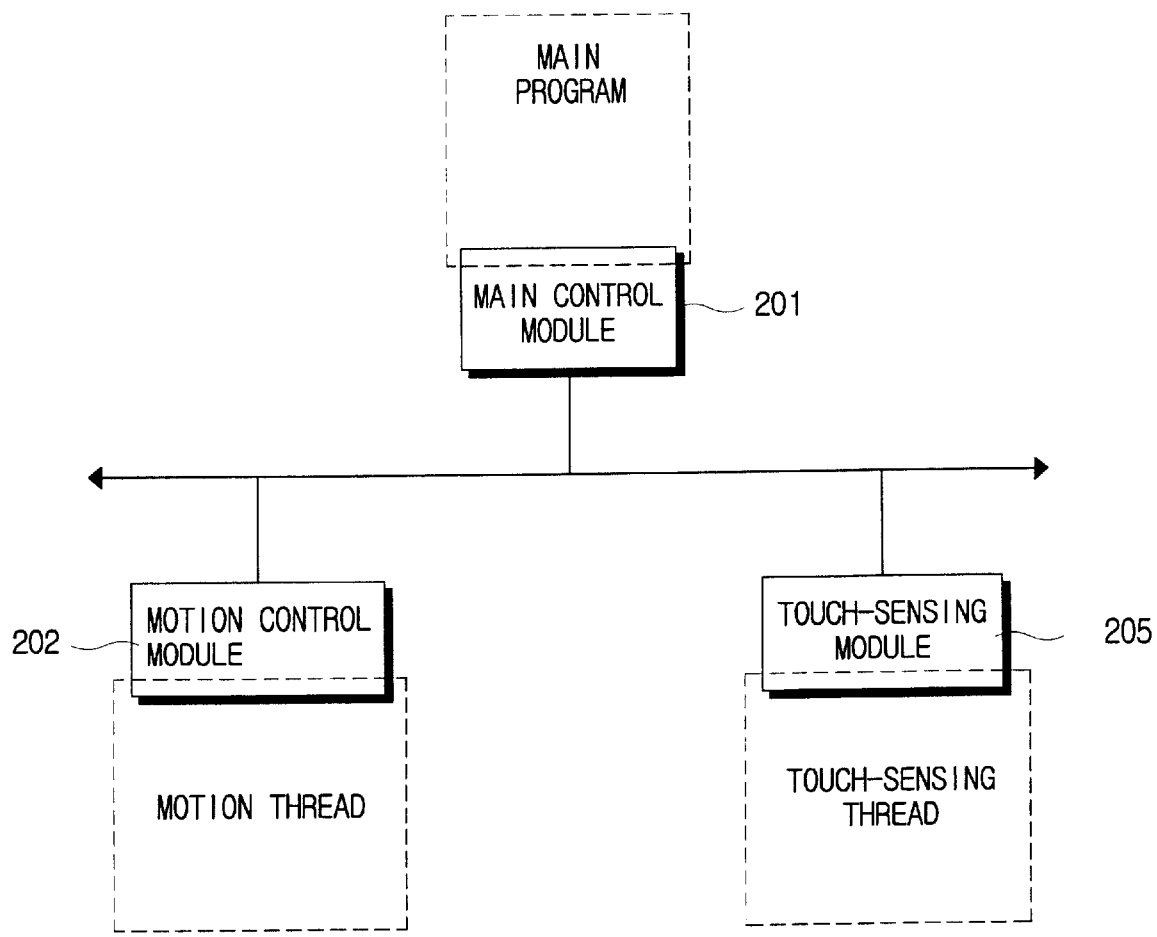
FIG. 2 is a control block diagram of a welding robot system of FIG. 1.

FIG. 2 is a control block diagram of the controller 21 of the welding robot system 1.

It is preferable that a central processing unit (not shown) provided in the controller 21 is an 8086 series microprocessor. As illustrated therein, the controller 21 is comprised of a main control module 201 for generally controlling to perform a welding operation appropriate for the workpiece, a motion control module 202 for controlling travelling paths of the welding robots 5a and 5b and a touch sensing module 205 for touch-sensing the workpiece.

The controller 201 according to the present invention employs a real-time operating system enabling real-time multi-tasking, allowing a motion thread and a touch sensing thread to be operated simultaneously by the motion control module 202 and the touch sensing module 205, respectively. The motion thread is to control travelling paths of the welding robots 5a and 5b whereas the touch sensing thread is to touch-sense the workpiece by the welding torches 7a and 7b. Here, the term "thread" refers to a group of tasks performed simultaneously through multi-tasking by time division.

The motion thread and the touch sensing thread are independently performing their own tasks, but if necessary, they exchange data each other by a main program performed by the main control module 201 or by generating interrupts between them.

A worker provides an appropriate main program according to the size and shape of the workpiece and a desired quality of welding, to perform a welding operation. The main program is a welding operation program executed by the main control module 201.

Figure 3:
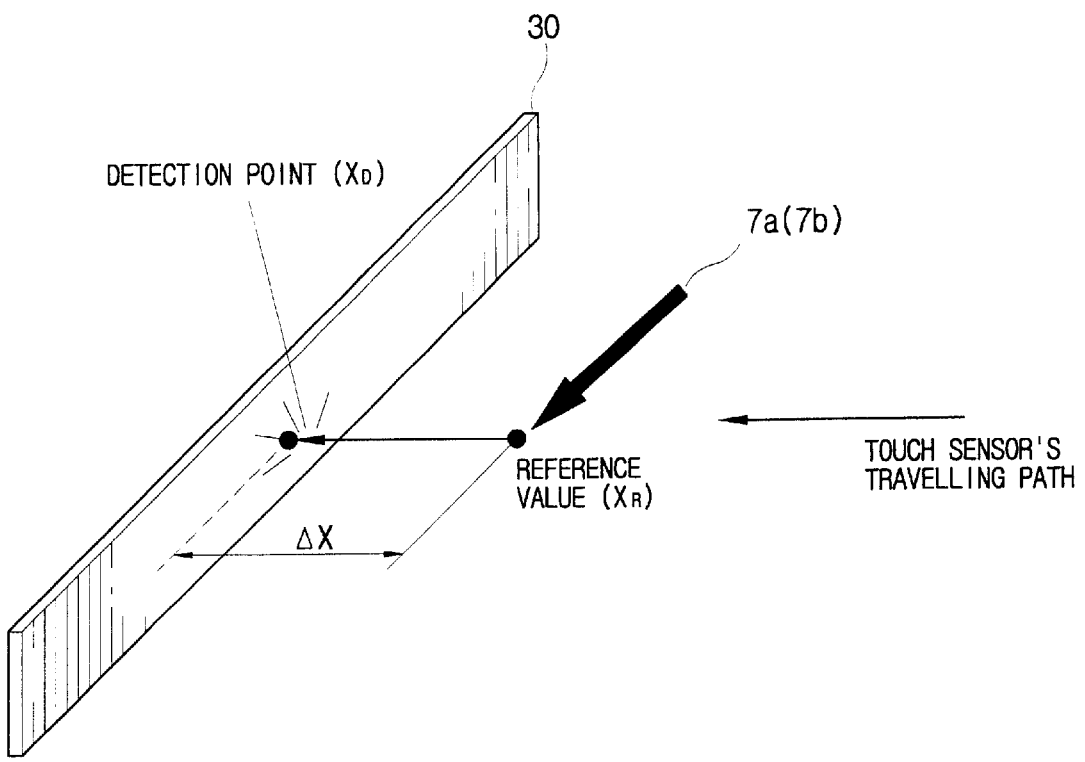
FIG. 3 is a view explaining a touch sensing according to the present invention.

FIG. 3 is a view explaining a touch sensing according to the present invention.

The touch sensing according to the present invention is performed basically in the same manner as in the touch sensing mechanism used in the conventional touch sensor tracking. That is, touch-sensing of the workpiece is to sense a sensing position by an interrupt generated as the welding wire having a positive pole, protruding to some length from the end parts of the welding torches contacts the workpiece having a negative pole.

The touch sensing process according to the present invention will be described in more detail.

The workpiece 30 is fixed on the welding jig 15 and then touch sensing is operated according to predetermined reference values for preset detection points. The reference values include directions of welding torches 7a and 7b relative to reference coordinate axes, travelling directions of the welding torches 7a and 7b, and an initial travelling point and a terminating travelling point of the welding torches 7a and 7b. The reference values could be represented in direction vectors to indicate directions of the welding torches 7a and 7b relative to the reference coordinate axes and in vectors to indicate travelling direction and distance of the welding torches. For example, if a detection point ($X_D$) is located on the point which a travelling distance of the welding torch on the X axis exceeds the distance of $\Delta X$ over the reference value ($X_R$), it means that the workpiece is displaced as much as $\Delta X$.

To use the touch sensing, detection points are preferably set up appropriately according to the size and shape of the workpiece and the quality of welding, etc. In order to detect a spatial location, at least three detection points should be set up on the X, Y and Z axes; however, it is not imperative. For example, if the workpiece is a standardized steel plate and a comparatively lower quality of welding is needed, only a fixed height can be considered to confirm whether the workpiece is correctly fixed, considering no horizontality of the fixed steel plate.

Figure 4:
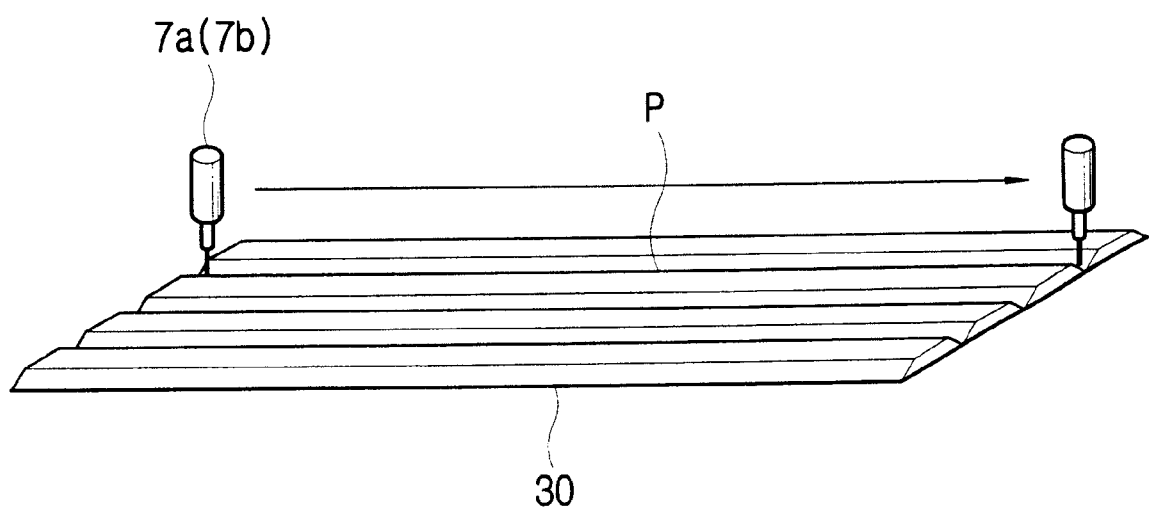
FIGS. 4 and 5 are schematic views of a method for correcting teaching points for a welding robot, according to the present invention.
Figure 5:
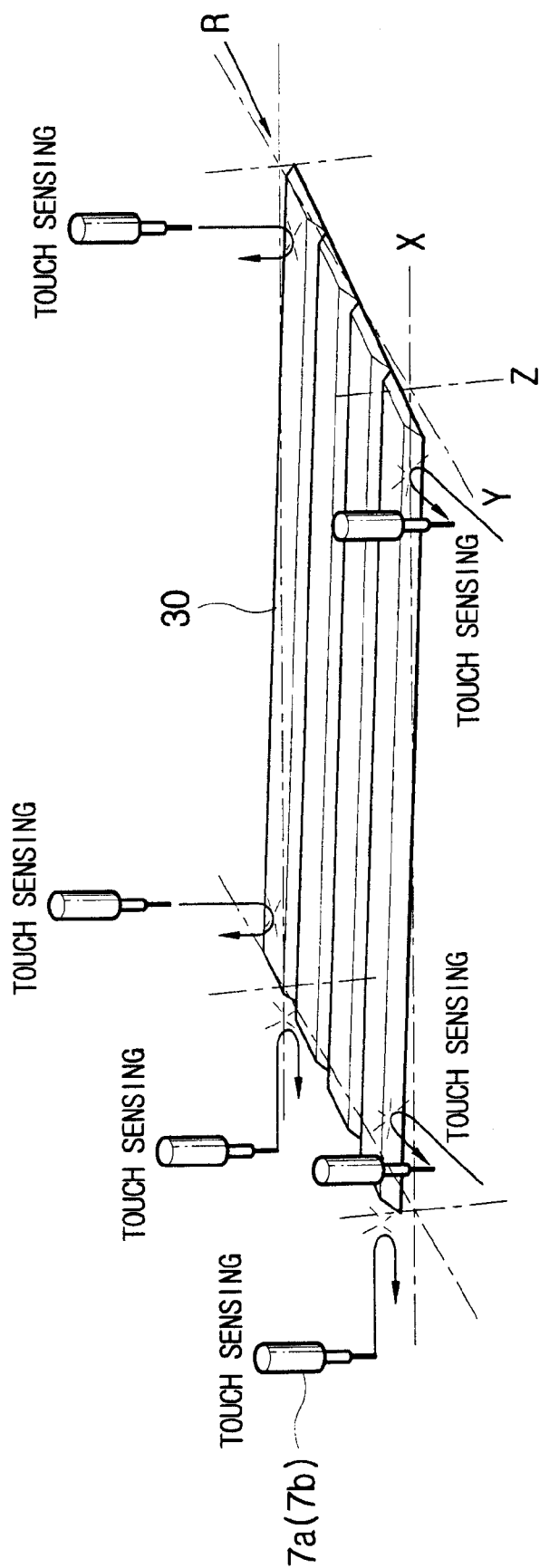
Figure 6:
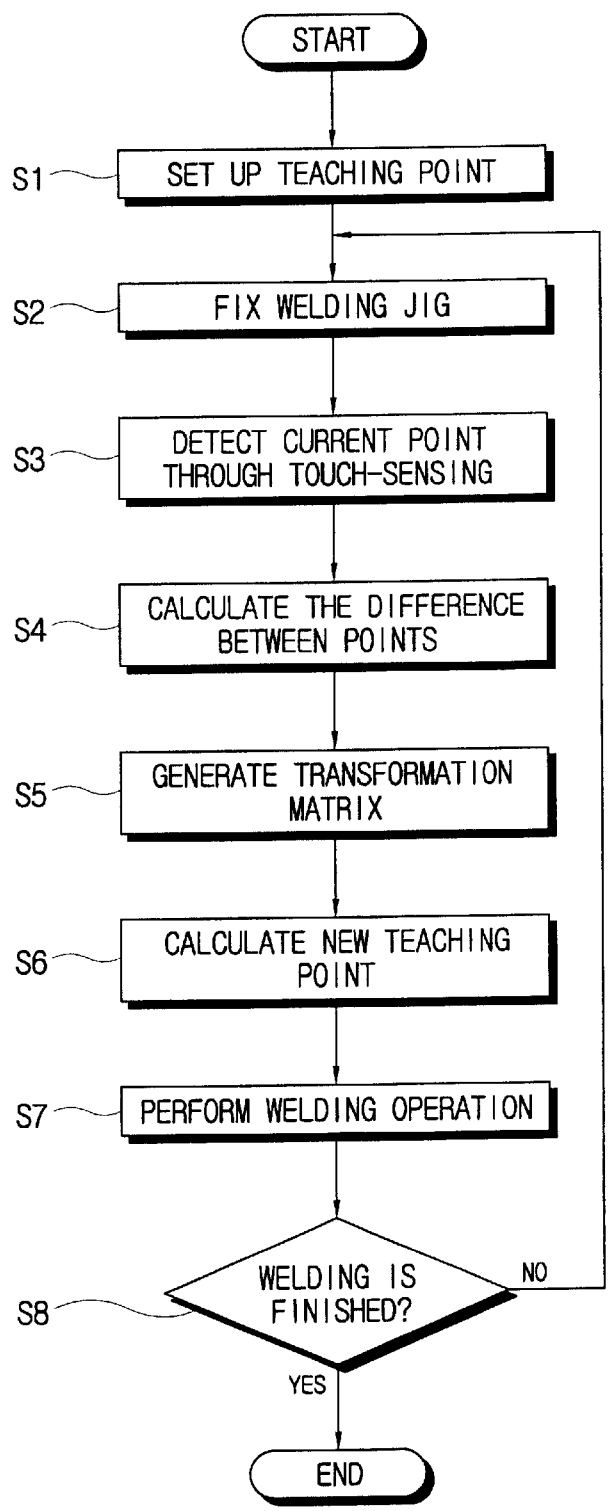
FIG. 6 is a control flow chart of a controller.

Hereinbelow, a method for correcting teaching points for a welding robot according to the present invention will be described, referring to FIGS. 4 through 6.

A worker chooses a main program appropriate for a welding operation for a workpiece to be welded, and establishes parameters for welding conditions and sets up the welding system, thereby allowing the main control module 201 to be executed. As depicted in FIG. 4, in the course of setting up the welding system, N teaching points for the welding robot are established relative to the workpiece 30 to be welded while moving the welding torches 7a or 7b along the welding path P where the workpiece 30 will be welded, and they are stored in the main control module 201 as space coordinates relative to the reference coordinate axes (S1). The space coordinate is, as shown in FIG. 5, represented with a reference coordinate system based on three-dimensional orthogonal axes (R) indicated on X, Y and Z axes. However, a cylindrical coordinate system or a polar coordinate system may be used as the reference coordinate system.

This process may be represented in the level of pseudo-code as follows:

Establishing a reference coordinate system [$W_0$], and

Teaching N points #Pnt_1–#Pnt_N.

If the teaching of the points is completed, the correction of the teaching points along the taught welding path is initiated. For the correction operation, the workpiece 30 is first fixed by the welding jig 15 (S2). Next, a touch sensing operation is performed. The touch sensing operation is conducted by allowing the workpiece 30 to touch the welding wire 11 provided in the end parts of the welding torches 7a or 7b (S3). The data to indicate points detected when the workpiece 30 and the wire 11 touch each other is transmitted to the motion thread activated by the motion control module 202, through an interrupt from the touch sensing thread. The motion thread calculates the detecting points based on the transmitted data to obtain point data relative to the reference coordinate and transmits them to the main control module 201.

The main control module 201 runs the main program to calculate the difference between the transmitted position data and the predetermined reference values (S4), and generates a transformation matrix on this basis (S5), and calculates new teaching points by multiplying the established teaching points by the transformation matrix (S6).

This process may be represented in the level of pseudo-code as follows:

Positioning the workpiece;

Touch-sensor tracking relative to the reference coordinate axes X, Y and Z;

Calculating $\Delta x$, $\Delta y$ and $\Delta z$, the displacement of the workpiece through the touch sensor tracking Generating the transformation matrix $T^N_0$ for transforming the displacement of the workpiece relative to the reference coordinate system [$W_0$]

Calculating values for transformed points relative to the teaching points #Pnt_1–#Pnt_N; and Transforming the teaching points to $T^N_0$#Pnt_1, $T^N_0$#Pnt_2, ..., $T^N_0$#Pnt_N.

The transformed teaching points replace the established teaching points and are stored as new teaching points. The main control module of the controller 21 drives the welding torches 7a and 7b according to the updated teaching points and performs the welding operation for the workpiece 30 (S7). When all the welding tasks are finished, the welding operation terminates (S8).

If all the welding tasks are not finished (S8), the processes from S2 through S7 will be repeated.

As described above, the teaching points are continuously updated every time a welding operation for a unit workpiece is performed. Accordingly, the welding robot system according to the present invention can be operated always with correct teaching points, thereby improving the precision of the welding path during the welding operation.

As an embodiment of the present invention, a method for correcting teaching points to weld a workpiece such as a large pipe in the shipyard will be explained.

According to several parameters such as combination with flanges, the kind of pipes as the workpiece to be welded is various and sometimes exceeds 100. In response, the teaching points should be in principle established over 100 times corresponding to the 100-over kinds of pipes. However, it is very troublesome to establish the teaching points suitable for all the pipes. In reality, a program for the welding operation becomes effective by using the correction method of teaching points through a macro-file according to the present invention as described below More specifically, teaching points for a first workpiece to be welded are corrected through touch tracking by a touch sensor provided in a welding robot, and thereafter, a welding operation is performed based on the corrected teaching points. Next, a second workpiece is positioned on the welding jig, and the displacement values of the second workpiece are calculated based on the teaching points of the first workpiece, and the teaching points are updated. The worker can conduct a welding operation with respect to the second workpiece different in shape by updating the teaching points, without establishing teaching points.

It is also possible to classify the workpieces into several categories and then to operate the welding by category.

The correction method of teaching points according to the present invention is applicable to heavy industries such as for boilers or ships, having an excellence in effect. In reality, large workpieces such as boiler pipes are very voluminous, for which the workpieces have frequently been displaced although they are fixed by means of a welding jig or a big positioner. However, according to the present invention, correct teaching points are obtained by using a transformation matrix flog relative to the reference coordinate system initially set up, and the correct welding operation is possible accordingly.

In the inventions described in the earlier patent applications by the present inventor as described in the section of "Background Art," related to a welding system using a touch sensor tracking, the touch sensor tracking is merely applied to find out an initial welding point and/or a terminating welding point for a unit welding operation. However, according to the transformation mechanism relative to the reference coordinate system through the transformation matrix by the touch sensor tracking according to the present invention, teaching points on the welding path as well as an initial welding point and a terminating welding point can be correctly established, without a separate, optional sensor tracking. In a word, whatever the workpiece is, the teaching points can be exactly updated by means of the transformation matrix, and so the present invention has a variety of industrial applications.

As described above, according to a correction method of teaching points for a welding robot of the present invention, the teaching points are correctly updated by a touch sensor tracking without additional equipment for optional sensor tracking, such as laser sensors, arc sensors, etc., thereby performing the welding operation along the correct welding path.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for correcting a locus of a teaching point for a welding robot having a touch sensor, comprising the steps of:
   mounting a workpiece to a welding jig;
   establishing a preset locus of at least one teaching point between an initial welding point and a terminating welding point;
   setting at least one detection point defined as a preset locus at said workpiece;
   touch-sensing the detection point at said workpiece;
   identifying a sensed locus of the detection point detected by the touch-sensing;
   generating a transformation matrix based on a difference between the preset locus of the detection point and the sensed locus of the detection point; and
   obtaining a new locus of the teaching point based on the transformation matrix.

2. The method according to claim 1, wherein the step of obtaining the new locus of the teaching point includes the step of calculating the new locus of the teaching point by multiplying the preset locus of the teaching point by the transformation matrix.

3. The method according to claim 1, wherein the touch sensor is comprised of a welding wire, provided at an end part of a welding torch.

4. The method according to claim 2, wherein the touch sensor is comprised of a welding wire, provided at an end part of a welding torch.

5. The method according to claim 1, the step of identifying comprising the steps of:
   transferring a datum obtained by the step of touch-sensing from a touch-sensing module to a motion control module;
   calculating the sensed locus of the detection point based on the datum; and
   transferring the calculated datum of the sensed locus of the detection point from the motion control module to a main control module.

6. The method according to claim 1, wherein said preset locus of said detection point is defined as a height of the fixed workpiece.

7. The method according to claim 1, wherein said preset locus of the teaching point is defined as a coordinate of a reference coordinate system.

8. The method according to claim 7, wherein said reference coordinate system is based on three-dimensional orthogonal axes.

9. The method according to claim 7, wherein said reference coordinate system is a cylindrical coordinate system.

10. The method according to claim 7, wherein said reference coordinate system is a polar coordinate system.

11. The method according to claim 1, wherein the step of touch-sensing is performed according to predetermined reference values including directions of torches, traveling directions of welding torches, and an initial and a terminating traveling points of the welding torches, and said predetermined reference values are represented in vectors.

12. A welding robot system comprising:
   a welding jig supporting a workpiece to be welded;
   a welding robot performing a welding operation to the workpiece and having a touch sensor; and
   a controller storing a preset locus of a teaching point and a preset locus of a detection point, said controller identifying a sensed locus of the detection point detected by touch-sensing the workpiece mounted to the welding jig through the touch sensor, said controller calculating a difference between the preset locus of the detection point and the sensed locus of the detection point, said controller generating a transformation matrix based on the difference, said controller obtaining a new locus of the teaching point based on the transformation matrix, said controller controlling the welding robot based on the new locus of the teaching point.

13. The system according to claim 12, the controller calculating the new locus of the teaching point by multiplying the teaching point by the transformation matrix.

14. The system according to claim 12, wherein the touch sensor is comprised of a welding wire, provided at an end part of the welding torch.

15. The system according to claim 13, wherein the touch sensor is comprised of a welding wire, provided at an end part of the welding torch.

16. The system according to claim 12, said controller further comprising a teaching pendant, said teaching pendant teaching welding parameters.

17. The system according to claim 16, said controller comprising:
   a main control module to perform the welding operation;
   a motion control module for controlling traveling paths of the welding robots; and
   a touch-sensing module for touch-sensing the workpiece.

18. The system according to claim 17, said controller performing a motion thread and a touch thread simultaneously by said motion control module and said touch sensing module.

19. A method for correcting a preset locus of a teaching point for a welding robot having a touch sensor, comprising the steps of:
   positioning a workpiece on a welding jig;
   performing a touch-sensor tracking for said workpiece relative to reference coordinate axes;
   calculating a displacement of said workpiece through the touch-sensor tracking;
   generating a transformation matrix based on said displacement; and
   obtaining a new locus of the teaching point based on said transformation matrix.

20. The method according to claim 19, the step of performing the touch-sensor tracking comprising the steps of:
   establishing at least one detection point at said workpiece, said detection point corresponding to a predetermined reference value; and touch-sensing the workpiece according to the predetermined reference value.

21. The method according to claim 20, the step of calculating the displacement comprising the steps of:

identifying a sensed locus obtained by touch-sensing the workpiece; and calculating a deviation between said predetermined reference value and said sensed locus.

22. The method according to claim 21, the step of identifying comprising the steps of:

transferring data obtained by the touch-sensor tracking from a touch-sensing module to a motion control module;

calculating the sensed locus of the detection point based on the data, said sensed locus of the detection point defined as coordinates of a reference coordinate system; and transferring the calculated data of the sensed locus of the detection point from the motion control module to a main control module.

23. The method according to claim 20, wherein said detection point is for detecting a height of the fixed workpiece.

24. The method according to claim 20, said detection point comprising three points for detecting a position in reference three-dimensional orthogonal axes.

25. The method according to claim 19, the step of obtaining the new locus of the teaching point comprising the step of multiplying the preset locus of the teaching point by the transformation matrix.

26. The method according to claim 19, said touch sensor comprising a welding wire, said touch sensor provided at an end part of a welding torch.

* * * * *